(12) United States Patent
Agafonov et al.

(10) Patent No.: US 10,429,012 B2
(45) Date of Patent: Oct. 1, 2019

(54) METHOD OF FABRICATING A LIGHT EMITTING DEVICE WITH OPTICAL ELEMENT

(71) Applicant: Sensor Electronic Technology, Inc., Columbia, SC (US)

(72) Inventors: Igor Agafonov, Columbia, SC (US); Michael Shur, Latham, NY (US); Alexander Dobrinsky, Loudonville, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 75 days.

(21) Appl. No.: 15/420,379

(22) Filed: Jan. 31, 2017

(65) Prior Publication Data
US 2017/0219174 A1    Aug. 3, 2017

Related U.S. Application Data (60) Provisional application No. 62/289,330, filed on Jan. 31, 2016.

(51) Int. Cl.
| | |
|---|---|
| H01L 21/86 | (2006.01) |
| F21K 9/90 | (2016.01) |
| F21V 17/02 | (2006.01) |
| F21V 17/10 | (2006.01) |
| F21V 17/12 | (2006.01) |
| H01L 33/58 | (2010.01) |
| H01L 21/66 | (2006.01) |

(52) U.S. Cl.
CPC ............... *F21K 9/90* (2013.01); *F21V 17/02* (2013.01); *F21V 17/101* (2013.01); *F21V 17/12* (2013.01); *H01L 22/20* (2013.01); *H01L 33/58* (2013.01); *H01L 2933/0033* (2013.01); *H01L 2933/0058* (2013.01)

(58) Field of Classification Search
CPC .......... F21K 9/90; F21V 17/02; F21V 17/101; F21V 17/12; F21V 21/14; F21V 23/0442; H01L 33/58; H01L 22/20; H01L 2933/0033; H01L 2933/0058; H01L 21/67259
See application file for complete search history.

(56) References Cited

U.S. PATENT DOCUMENTS

| | | | | |
|---|---|---|---|---|
| 5,233,444 | A * | 8/1993 | Musha | ............... G02B 7/32 250/201.5 |
| 9,548,429 | B2 | 1/2017 | Shatalov et al. | |
| 9,562,171 | B2 | 2/2017 | Gaska et al. | |
| 9,627,351 | B2 | 4/2017 | Bilenko et al. | |
| 2009/0103293 | A1 * | 4/2009 | Harbers | ............... F21V 9/40 362/231 |

(Continued)

*Primary Examiner* — Roy K Potter
(74) *Attorney, Agent, or Firm* — LaBatt, LLC (57) ABSTRACT

A solution for packaging an optoelectronic device by aligning an optical element with respect to the package is provided. After initial placement of the optical element on the device package, an emitted light pattern can be measured and compared to a target light pattern. Subsequently, the position of the optical element can be adjusted. The emitted light pattern can be repeatedly compared to the target light pattern until the emitted light pattern is within an acceptable range of error and the optical element can be secured to the device package.

18 Claims, 7 Drawing Sheets

(56) References Cited

U.S. PATENT DOCUMENTS

| | | | |
|---|---|---|---|
| 2009/0212709 A1* | 8/2009 | Meijer | F21S 10/02 |
| | | | 315/153 |
| 2010/0019686 A1* | 1/2010 | Gutierrez, Jr. | F21S 10/02 |
| | | | 315/291 |
| 2012/0206590 A1* | 8/2012 | Yamamoto | G02B 7/28 |
| | | | 348/79 |
| 2015/0145419 A1* | 5/2015 | Lashina | H05B 33/0872 |
| | | | 315/153 |
| 2016/0064631 A1 | 3/2016 | Shatalov et al. | |
| 2016/0088868 A1 | 3/2016 | Dobrinsky et al. | |
| 2017/0218208 A1 | 8/2017 | Bettles et al. | |
| 2017/0219854 A1 | 8/2017 | Simin et al. | |

* cited by examiner

METHOD OF FABRICATING A LIGHT EMITTING DEVICE WITH OPTICAL ELEMENT

REFERENCE TO RELATED APPLICATIONS

The current application claims the benefit of U.S. Provisional Application No. 62/289,330, which was filed on 31 Jan. 2016, and which is hereby incorporated by reference.

TECHNICAL FIELD

The disclosure relates generally to emitting devices, and more particularly, to a solution for aligning an optical element for a device package.

BACKGROUND ART

Packaging of Light Emitting Devices (LEDs), and in particular, ultraviolet (UV) and deep ultraviolet (DUV) LEDs, is a mature field with corresponding problems and challenges. Several aspects of packaging have to be considered in order to fabricate effective LEDs as well as photodiodes, and more specifically UV LEDs. Thermal management of the devices is crucial, specifically for UV LEDs, due to their low efficiency. Furthermore, the package preferably includes optical elements that need to be placed and aligned within the package to deliver optimal light extraction from UV LED devices, as well as target power distribution. For thermal management, flip chip design is frequently adopted to improve heat extraction from UV LEDs. For power LEDs, attention has to be paid to the interfaces between the UV LED die and the submount, or the UV LED and the Surface-Mount Device (SMD) package. The mirror elements, as well as lenses or waveguides, have to be carefully aligned against the location of the LED die for optimal light extraction. Frequently, the optical elements are mounted using an encapsulant that is capable of fixing the optical elements relative to the LED die. It is frequently desired to be able to execute fine alignment of the optical elements relative to the package.

SUMMARY OF THE INVENTION

The present invention outlines a solution for aligning optical elements with respect to the package, wherein magnetic or mechanical forces are used to manipulate the placement of optical elements, followed by curing the encapsulant for final fixation of the optical elements. In particular, for cases when a magnetic field is used, the optical elements can include regions having ferromagnetic domains.

Aspects of the invention provide a solution for packaging an optoelectronic device by aligning an optical element with respect to the package. After initial placement of the optical element on the device package, an emitted light pattern can be measured and compared to a target light pattern. Subsequently, the position of the optical element can be adjusted. The emitted light pattern can be repeatedly compared to the target light pattern until the emitted light pattern is within an acceptable range of error and the optical element can be secured to the device package.

A first aspect of the invention provides a method of packaging an optoelectronic device, the method comprising: mounting an optical element over an opening in a casing, wherein the casing encloses the optoelectronic device mounted on a submount; sensing an emitted light pattern emitted from the optoelectronic device through the optical element; comparing the emitted light pattern to a target light pattern to determine a difference between the emitted light pattern and the target light pattern; adjusting, in response to the difference being greater than an acceptable range of error, a position of the optical element over the opening; and securing, in response to the difference being less than or equal to the acceptable range of error, the optical element to the casing.

A second aspect of the invention provides a method of packaging a light emitting diode (LED), the method comprising: mounting an optical element over an opening in a casing, wherein the casing encloses the LED mounted on a submount; sensing an emitted light pattern emitted from the LED through the optical element; comparing the emitted light pattern to a target light pattern to determine a difference between the emitted light pattern and the target light pattern; adjusting, in response to the difference being greater than an acceptable range of error, a position of the optical element over the opening; and securing, in response to the difference being less than or equal to the acceptable range of error, the optical element to the casing.

A third aspect of the invention provides a method of packaging an array of optoelectronic devices, the method comprising: mounting an array of optical elements over the array of optoelectronic devices; sensing an emitted light pattern emitted from the array of optoelectronic devices through the array of optical elements; comparing the emitted light pattern to a target light pattern to determine a difference between the emitted light pattern and the target light pattern; adjusting, in response to the difference being greater than an acceptable range of error, a position of at least one optical element in the array of optical elements; and securing, in response to the difference being less than or equal to the acceptable range of error, the array of optical elements over the array of optoelectronic devices.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 3A shows a system for adjusting an optical element in an illustrative device package according to an embodiment, while

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a solution for packaging an optoelectronic device by aligning an optical element with respect to the package. After initial placement of the optical element on the device package, an emitted light pattern can be measured and compared to a target light pattern. Subsequently, the position of the optical element can be adjusted. The emitted light pattern can be repeatedly compared to the target light pattern until the emitted light pattern is within an acceptable range of error and the optical element can be secured to the device package.

As used herein, unless otherwise noted, the term "set" means one or more (i.e., at least one) and the phrase "any solution" means any now known or later developed solution. As also used herein, a layer is a transparent layer when the layer allows at least ten percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength+/−five nanometers) by an active region of an optoelectronic device during operation of the device. For a given layer, the wavelength can be measured in a material of consideration and can depend on a refractive index of the material.

In general, embodiments of the invention can be directed to any of various types of optoelectronic devices. For example, the optoelectronic device can be configured to operate as an emitting device, such as a light emitting diode (LED) or a laser diode (LD), a photo-multiplier, and/or as a light sensing device, such as a photodetector. The electromagnetic radiation emitted and/or sensed by the optoelectronic device can have a peak wavelength within any range of wavelengths, including visible light, ultraviolet radiation, deep ultraviolet radiation, infrared light, and/or the like. In an embodiment, the optoelectronic device is configured to emit and/or sense radiation having a dominant wavelength within the ultraviolet range of wavelengths. In another illustrative embodiment, the optoelectronic device operates in a spectral range from approximately 200 nanometers to approximately 400 nanometers.

A typical optoelectronic device includes a light emitting/sensing semiconductor heterostructure comprising: an n-type contact layer; a light generating/sensing structure having a first side adjacent to the n-type contact layer. The light generating/sensing structure can include a set of quantum wells and barriers. In addition, the heterostructure can include a p-type contact layer adjacent to the second side of the light generating/sensing structure. The p-type contact layer can be, for example, a semiconductor laminate structure. The entire structure can comprise group III nitride-based semiconductor layers of $Al_xB_yIn_zGa_{1-x-y-z}N$ composition (where $0 \le x,y,z \le 1$, and $x+y+z \le 1$), where, in general, molar fractions of all elements can vary from zero to one. An illustrative group III nitride-based p-type semiconductor laminate structure can include: an AlGaN electronic blocking layer with a high molar fraction of aluminum; an AlGaN grading layer or $Al_xGa_{1-x}N/Al_yGa_{1-y}N$ superlattice; a set of GaN layers; p-GaN heavily doped layers; and/or the like. Regardless, an optoelectronic device can be fabricated by etching part of a p-contact and light generating structure to access the n-type contact layer. The n-type contact layer can be contacted with a n-type electrode. The device can be flip chip mounted on a submount. The submount, can be positioned inside a device package that can be mounted on a board capable of delivering power to operate the optoelectronic device.

Figure 1:
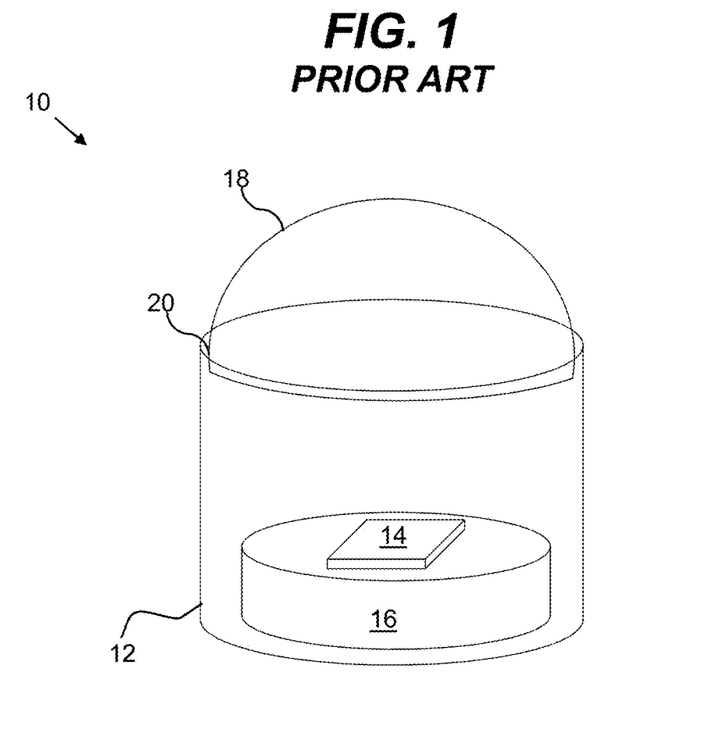
FIG. 1 shows a prior art device package.

Turning to the drawings, FIG. 1 shows a device package 10 according to the prior art. The device package 10 includes a casing 12 with a reflective cavity that is configured to contain an optoelectronic device, such as a light emitting diode (LED) die 14, positioned on top of a submount 16. Although it is not shown, the casing 12 can include other optical components. Alternatively, the device package 10 may not include the casing 12 and the submount 16 can include a SMD package. In a SMD package, a reflector would be mounted on the submount 16 or the submount can include an indentation for mounting the LED die 14. The device package 10 can include an optical element 18 that is positioned over an opening 20 of the casing 12. The optical element 18 can comprise an optical window element, a lens, a wave guiding element, and/or the like. In this device package 10, small errors in the position of the optical element 18, the LED die 14, and/or the submount 16 can lead to the loss of focus of the light. Therefore, it is preferred to design a feedback system for improvement in optical properties of a LED device.

Figure 2:
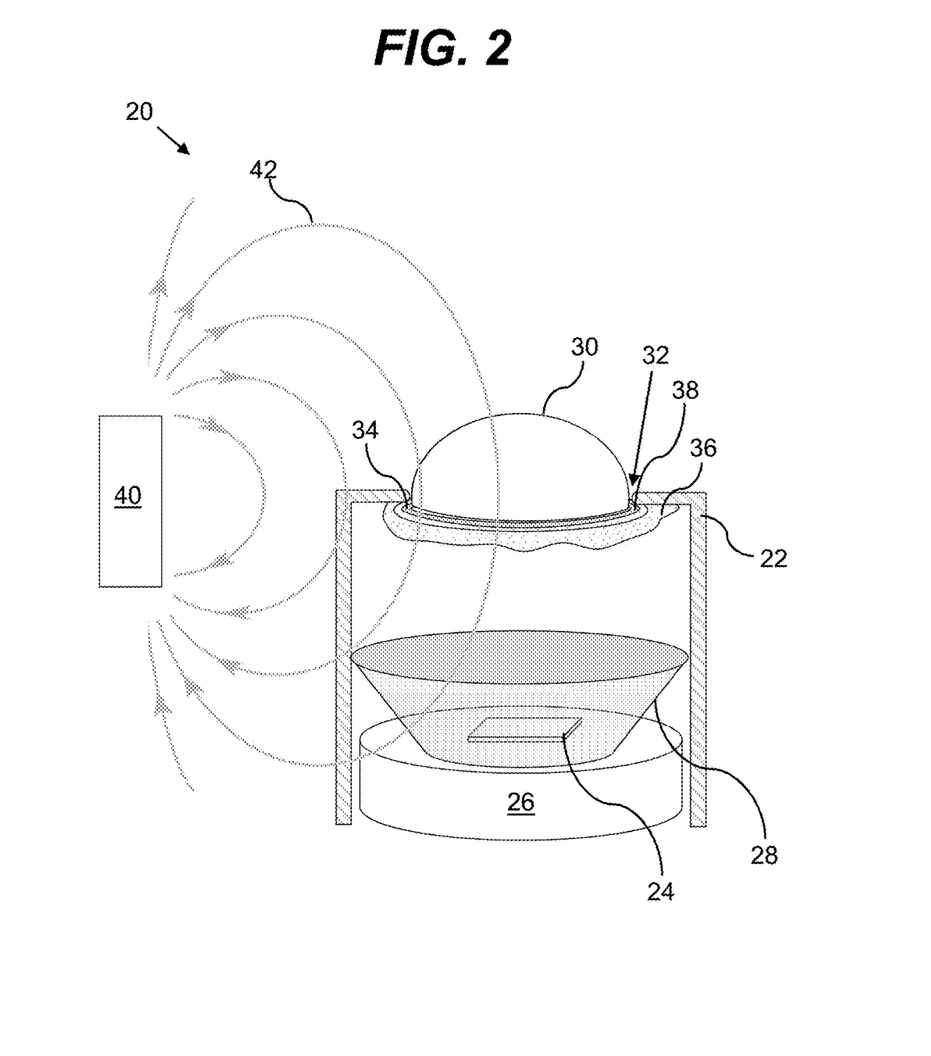
FIG. 2 shows an illustrative device package according to an embodiment.

FIG. 2 shows an illustrative device package 20 according to an embodiment. The device package 20 can include a casing 22 that is configured to contain a LED die 24 mounted on a submount 26, similar to the device package 10 shown in FIG. 1. Although only one LED die 24 is shown, it is understood that there can be any number of LED dies. The LED die 24 can be mounted to the submount 26 using any means. In another embodiment, the LED die 24 is mounting using soldering. Similarly, the positioning and mounting of the optical element 30 can be by various mechanical means. The positioning of optical element 30 can be by using pressure created by a gas. The optical element 30 mounting can involve materials capable of changing geometrical characteristics and capable of applying mechanical forces due to thermal expansion, piezo-electric forces resulted from piezo-materials connected to the application of voltage to the materials, and/or the like. It is understood that mounting of submount 26 can be also achieved by applying mechanical forces due to thermal expansion, piezo-electric forces resulted from piezo-materials connected to the application of voltage to the materials. Regardless, the device package 20 can also include a truncated conical insert 28 that is mounted on the submount 26 around the LED die 24. In an embodiment, the submount 26 can be mounted on a region (not shown), using, for example, soldering, and the region can contain electrical leads and can comprise a ceramic domain. In another embodiment, this region can have a high thermal conductivity and comprise SiC, AlN, diamond film, and or other semiconductors and/or insulators with high thermal conductivity. In an embodiment, at least the inner surface of the truncated conical insert 28 can be formed of a reflective material, such as polished aluminum, fluoropolymers, such as ethylene tetrafluoroethylene hexafluoropropylene fluoroterpolymer (EFEP), polytetrafluoroethylene (PTFE), and/or the like. In another embodiment, the inner surface of the truncated conical insert 28 can diffusively reflective and be formed of a highly ultraviolet reflective expanded polytetrafluoroethylene (ePTFE) material (e.g., GORE® Diffuse Reflector Material), and/or the like. The truncated conical insert 28 can be attached to the submount 28 using any means, such as, glue (e.g., epoxy, and/or the like), soldering, and/or the like.

The casing 22 can be similar to the casing 12 shown in FIG. 1 and can be configured to contain the submount 26 with the LED die 24 in order to enclose the emitted UV radiation from the LED die 24. However, the casing 22 also can be configured to support the optical element 30 that is positioned in an opening 32 in the casing 22. In an alternative embodiment, the device package 20 may not include the casing 22 and the optical element 30 can be supported by the truncated conical insert 28 or directly supported by the submount 26. The optical element 30 can comprise an optical window element, a lens, a wave guiding element, a Fresnel lens, a mirror element, a transparent light guiding element, a fluorescent element, and/or the like.

In an embodiment, the optical element 30 can include a lip extension 34 that is used to attach the optical element 30 to the casing 22. In an embodiment, mechanical means can be used to attach and adjust the optical element 30 to the casing 22. For example, tweezers can be used to place and adjust the optical element 30. In another embodiment, an adhesive material 36 can be used to attach the optical element 30 to the casing 22. For example, the adhesive material 36 can include a glue, an epoxy, a fluoropolymer, soldering metals, and/or the like. In another embodiment, the lip extension 34 can include a set of ferromagnetic domains 38 that is used to guide the optical element 30 to the casing 22. In an embodiment, the casing 22 can include additional ferromagnetic domains (not shown) and magnetic domains (not shown) in the casing 22 that surrounds the opening 32 to allow attachment of set of ferromagnetic domains 38 to the casing 22. A magnet 40, such as a permanent magnet, an electromagnet, and/or the like, can be used to manipulate the set of ferromagnetic domains 38 using a magnetic field 42. For example, the optical element 30 can be first positioned within an opening 32 of the casing 22, and a magnet 40 can be moved to result in subsequent motion of the optical element 30 for optimizing the position of the optical element 30. It is understood that the magnetic domains in the casing 22 that surrounds the opening 32 can comprise electromagnetic regions that can be activated through the application of current. Therefore, the controlled attachment of the set of ferromagnetic domains 38 to the casing 22 can be achieved when magnetic action of magnetic domains within the casing 22 that surrounds the opening 32 is turned on.

In an embodiment, the adhesive material 36 can include a UV curing medium. For example, the adhesive material 36 can comprise a polymer, such as epoxy, or acrylic resin, and/or the like, that solidifies when exposed to UV light from the LED die 24. In another example, the adhesive material 36 can comprise an epoxy, a set of polymers, a colloid material, and/or the like, that solidifies with time. That is, the adhesive material 36 initially can be in a semi-liquid resin state, which allows for the initial placement and subsequent adjustment of the optical element 30, and then the adhesive material 36 can solidify and harden after a period of time had passed.

Figure 3A:
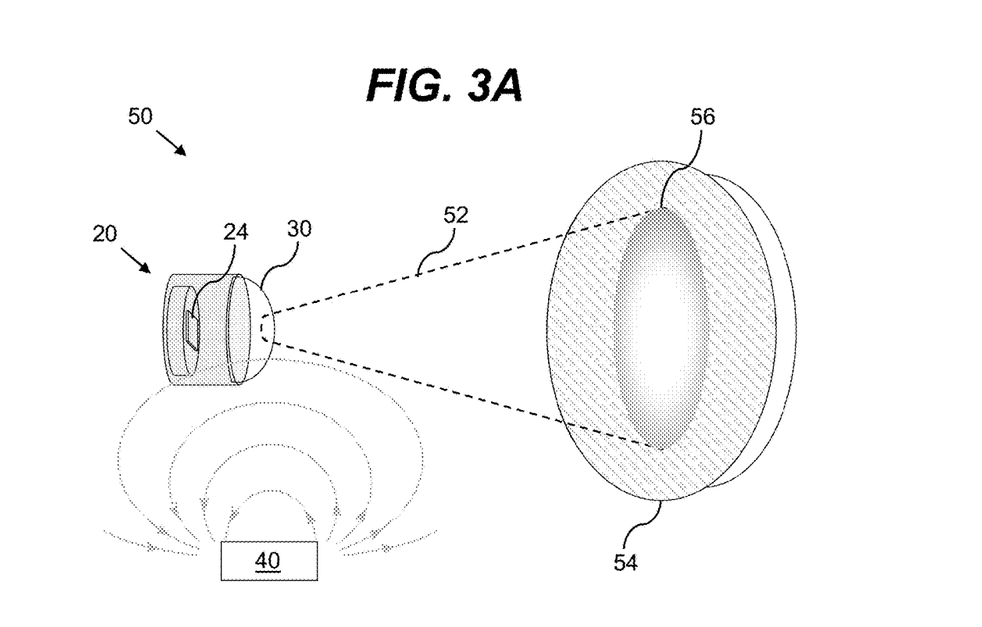
Figure 3B:
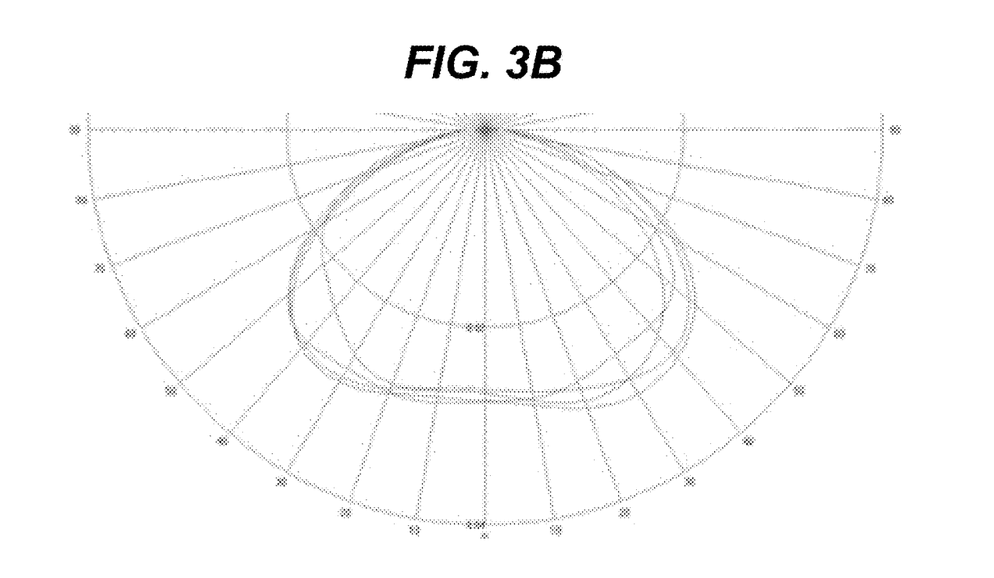
FIG. 3B shows an exemplary polar distribution plot of an emitted light pattern.

FIG. 3A shows a system 50 for adjusting the optical element 30 of the illustrative device package 20 shown in FIG. 2. It is understood that certain features of the device package 20 are omitted from FIG. 3A for clarity. Regardless, the system 50 shows that the light 52 emitted from the device package 20 can be captured by a light sensor 54, such as a UV sensor, and the emitted light pattern 56 can be measured to determine a difference between the light pattern 56 and a target light pattern. In response to the difference, the optical element 30 can be adjusted until the difference/error between the measured light pattern 56 and the target light pattern is within an acceptable range, wherein the acceptable range is identified for each optical device, depending on device application. The algorithm of adjusting the position of the optical element 30 can be gradient based, and the change in the position of the optical element 30 can be selected to minimize the error between the measured light pattern 56 and the target light pattern. FIG. 3B shows a polar distribution plot of the various emitted light patterns.

Figure 4A:
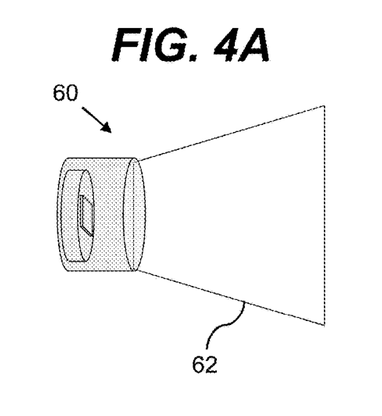
FIGS. 4A-4D show illustrative device packages according to embodiments.
Figure 4B:
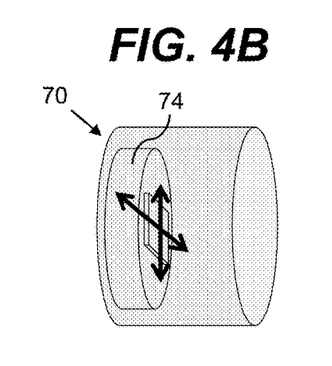
Figure 4C:
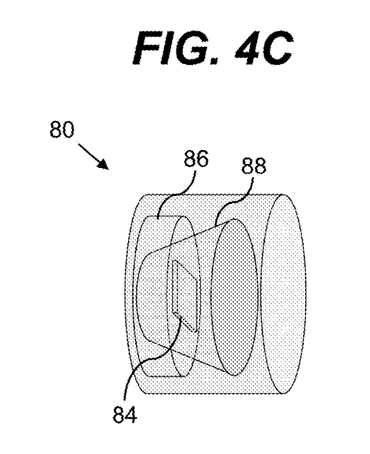

It is understood that the device package 20 shown in FIGS. 2 and 3A can include any type of optical element 30. For example, FIG. 4A shows an illustrative device package 60 that includes a light guiding cone 62. FIG. 4B shows an illustrative device package 70 which includes a LED die 74 that has ferromagnetic domains so that the LED die 74 can be moved using a magnetic field (e.g., by a magnet 40 (FIG. 2)). The movement of the LED die 74 can be further accompanied by the movement of the optical element if such an element is present in the LED device package 70. FIG. 4C shows an illustrative device package 80 that includes a truncated cone insert 88 that is mounted to the submount 86 and surrounds the LED die 84. In this embodiment, the truncated cone insert 88 can be used as an optical element and an inner surface of the truncated cone insert 88 comprises a reflective surface.

Figure 4D:
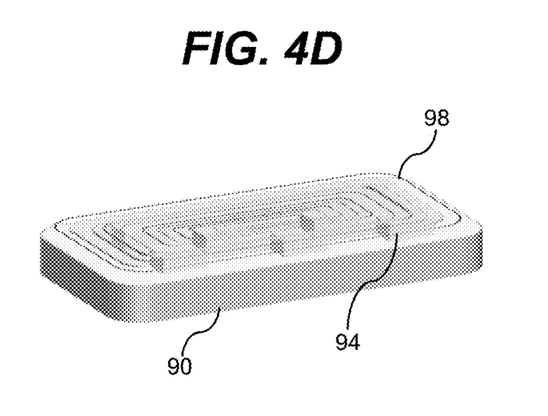

FIG. 4D shows an illustrative device package 90 that includes an array of LED dies 94. It is understood that the device package 90 can also include an array of other optoelectronic devices. Regardless, the device package 90 can include several adjustable optical elements that can be selectively manipulated using any number of methods discussed herein. For example, the optical elements can be adjusted using a combination of mechanical and magnetic means. In an embodiment, the package device 90 can include a Fresnel lens 98 that is positioned over the plurality of LED dies 94. Similar to a hemispherical lens, or a similarly curved lens, the Fresnel lens can contain ferromagnetic domains and its position can be further adjusted using a magnetic field, similar to the mounting process of optical elements outlined in this application. In an embodiment with an array of optoelectronic devices, the adjustment of the optical elements is made to form a particular pattern by using a predetermined pattern of adjusting the magnetic field (using a magnet 40 (FIG. 2)). For example, the predetermined pattern of adjusting the magnetic field can be used to form a particular emission beam shape, improve the emission uniformity from the array, and/or the like.

Figure 5:
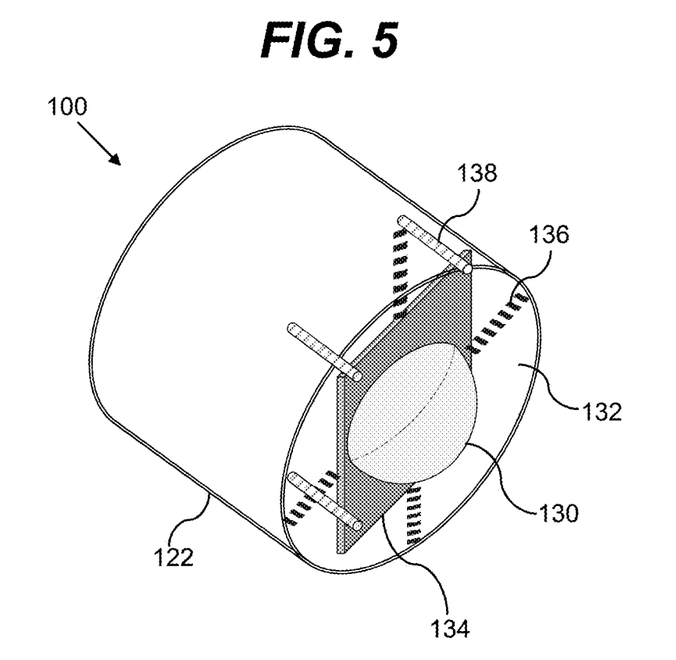
FIG. 5 shows an illustrative device package according to an embodiment.

FIG. 5 shows an illustrative device package 100 according to an embodiment. It is understood the device package 100 includes features, such as a submount, LED die, and/or the like, that are omitted from the figure for clarity. Regardless, the device package 100 includes a casing 122 with an opening 132. An optical element 130 is attached to a movable platform 134 located within the opening 132. Although the optical element 130 is shown as a spherical lens, it is understood that the optical element 130 can comprise any type of optical element, such as an optical window element, a wave guiding element, and/or the like. In an embodiment, the optical element 130 can be permanently attached to the movable platform 134 by means of gluing the optical element 130 through the use of epoxy, for example. In another embodiment, the optical element 130 can include a lip extension similar to the lip extension 34 in the device package 20 shown in FIG. 2. The optical element 130 can include a set of ferromagnetic domains that are used to attach the optical element 130 via the lip extension to the movable platform 134.

In an embodiment, the movable platform 134 can be attached to the casing 122 by a plurality of springs 136. The plurality of springs 136 allow for the movable platform 134 to have 1, 2, or 3 degrees of freedom. Once the movable platform 134 is positioned to achieve an emitted light pattern from the LED die (not shown) through the optical element 130 that is within an acceptable error of a target light pattern, the movable platform 134 can be fixed in the corresponding position using any method, such as a plurality of screws 138, a plurality of bolts, glue, combination of above methods, and/or the like. Although not shown, it is understood that the movable platform 134 can include a set of ferromagnetic regions that can be used, with a magnet, to move the movable platform 134.

Figure 6:
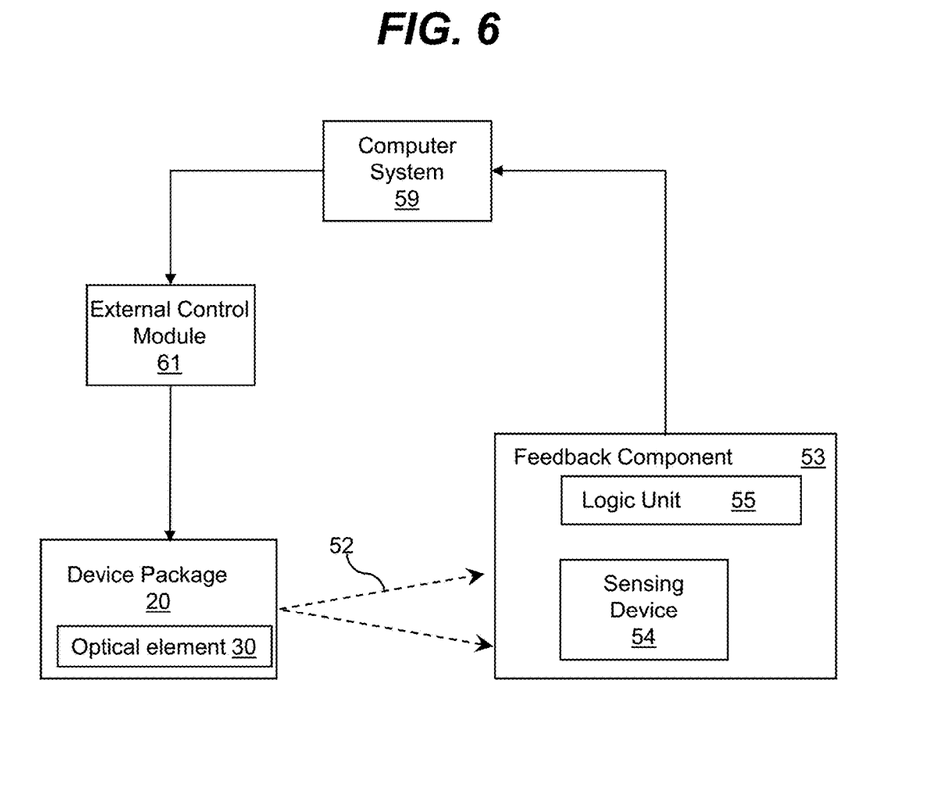
FIG. 6 shows an illustrative system including an illustrative device package according to an embodiment.

FIG. 6 shows an illustrative system for aligning an optical element 30 of an illustrative device package 20 to achieve an emitted light pattern within an acceptable error of a target light pattern according to an embodiment. The device package 20 and the optical element 30 can include any of the embodiments described herein. Regardless, the optical element 30 is placed on the device package 20 and the emitted light pattern 52 from the device package 20 is generated. A feedback component 53 is configured to sense the emitted light 52 from the device package 20 using a sensing device 54. The feedback component 53 also includes a logic unit 55 that receives data from the sensing device 54 and compares the data (e.g., the emitted light pattern 52) to a target light pattern. A difference between the emitted light pattern 52 and the target light pattern is received by the computer system 59 (e.g., programmed computing device) and processed to determine whether the optical element 30 needs to be adjusted (e.g., moved) or if the difference is within an acceptable range of error and the optical element 30 can be fixed in that position.

If the optical element 30 needs to be adjusted, the computer system 59 also can determine how much movement is required and in which direction(s). This information is provided to an external control module 61 which can adjust the optical element 30 accordingly using a magnetic force (e.g., a magnet 40 (FIG. 2)), a mechanical means (e.g., tweezers), and/or the like. The feedback component 53 can repeat these steps until the emitted light pattern is within an acceptable range of error of the target light pattern. Once the optical element 30 is in a position to provide an emitted light pattern 52 within an acceptable range of error, the external control module 61 can fix the optical element 30 in the corresponding position by, for example, operating the LED die to cure the adhesive material 36 (FIG. 2), applying a plurality of screws 138 (FIG. 5), and/or the like. In another embodiment, the feedback component 53 can repeat these steps for a target number of adjustments and the external control module 61 can fix the optical element 30 in the position that provides an emitted light pattern with the smallest range of error.

In an embodiment, the placement of the optical element 30 can first be evaluated using numerical stimulation and the emitted light pattern can be predicted based on the linear interpolation of the results. The placement of the optical element 30 can be selected using Newton's iterations.

In an embodiment, the external control module 61 will only turn on the device when the emitted light pattern is measured by the sensing device 54 in order to prevent overheating of the device and to prevent curing the adhesive material 36 (FIG. 2).

While illustrative aspects of the invention have been shown and described herein primarily in conjunction with a device package for an optoelectronic device and a method of fabricating such a device package, it is understood that aspects of the invention further provide various alternative embodiments.

Figure 7:
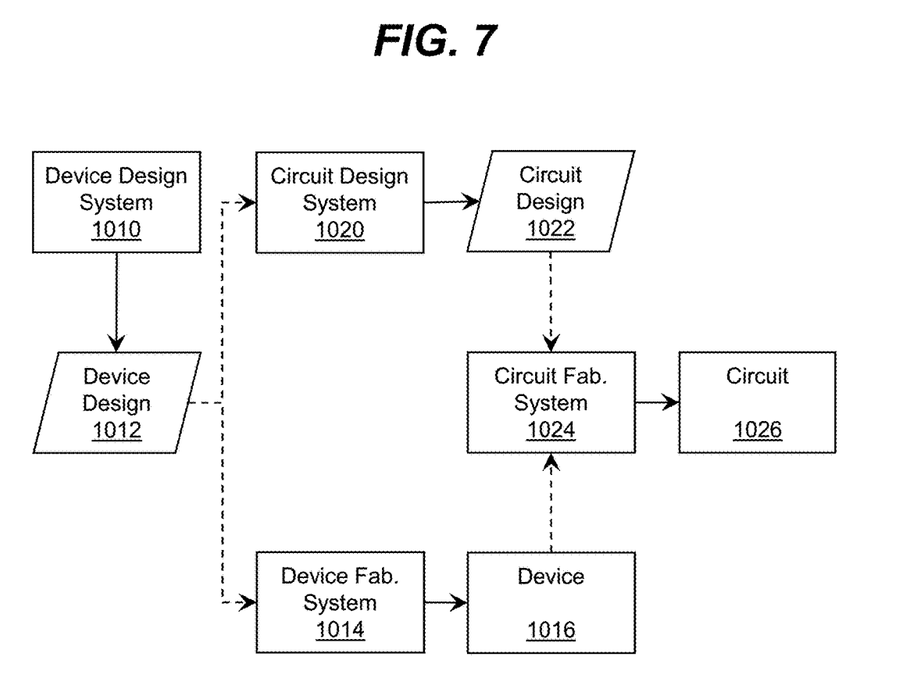
FIG. 7 shows an illustrative flow diagram for fabricating a circuit according to an embodiment.

In one embodiment, the invention provides a method of designing and/or fabricating a circuit that includes one or more of the packaged devices designed and fabricated as described herein. To this extent, FIG. 7 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. To this extent, the device fabrication system 1014 can include a magnet, which can be used to adjust an optical element relative to the packaged device. Still further, the device fabrication system 1014 can include a light sensor, which can be used to determine if the emitted light pattern from the packaged device is sufficiently close to a target light pattern.

Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of packaging an optoelectronic device, the method comprising:
    mounting an optical element over an opening in a casing, wherein the casing encloses the optoelectronic device mounted on a submount, and wherein the optical element includes a lip extension with a set of ferromagnetic regions;
    sensing an emitted light pattern emitted from the optoelectronic device through the optical element;
    comparing the emitted light pattern to a target light pattern to determine a difference between the emitted light pattern and the target light pattern;
    adjusting, in response to the difference being greater than an acceptable range of error, a position of the optical element over the opening; and
    securing, in response to the difference being less than or equal to the acceptable range of error, the optical element to the casing.

2. The method of claim 1, wherein the optoelectronic device is a light emitting diode.

3. The method of claim 1, wherein the adjusting includes using a magnetic force to move the optical element.

4. The method of claim 1, further comprising applying an adhesive material between the optical element and the casing.

5. The method of claim 4, wherein the securing includes emitting light from the optoelectronic device in order for the adhesive to cure and harden.

6. The method of claim 1, wherein the optical element is mounted on a movable platform, wherein the movable platform is attached to the casing with a plurality of springs.

7. The method of claim 6, wherein the adjusting includes moving the movable platform using the plurality of springs.

8. The method of claim 6, wherein the securing includes fixing the movable platform to the casing using a plurality of screws.

9. A method of packaging a light emitting diode (LED), the method comprising:
    mounting an optical element over an opening in a casing, wherein the casing encloses the LED mounted on a submount, wherein the optical element is mounted on a movable platform, and wherein the movable platform is attached to the casing with a plurality of springs;
    sensing an emitted light pattern emitted from the LED through the optical element;
    comparing the emitted light pattern to a target light pattern to determine a difference between the emitted light pattern and the target light pattern;
    adjusting, in response to the difference being greater than an acceptable range of error, a position of the optical element over the opening; and
    securing, in response to the difference being less than or equal to the acceptable range of error, the optical element to the casing.

10. The method of claim 9, wherein the optical element includes a lip extension with a set of ferromagnetic regions and the adjusting includes using a magnetic force to move the optical element.

11. The method of claim 9, further comprising: applying an adhesive material between the optical element and the casing.

12. The method of claim 11, wherein the securing includes emitting light from the optoelectronic device in order for the adhesive to cure and harden.

13. The method of claim 9, wherein the adjusting includes moving the movable platform using the plurality of springs.

14. The method of claim 9, wherein the securing includes fixing the movable platform to the casing using a plurality of screws.

15. A method of packaging an array of optoelectronic devices, the method comprising:
    mounting an array of optical elements over the array of optoelectronic devices;
    sensing an emitted light pattern emitted from the array of optoelectronic devices through the array of optical elements;
    comparing the emitted light pattern to a target light pattern to determine a difference between the emitted light pattern and the target light pattern;
    adjusting, in response to the difference being greater than an acceptable range of error, a position of at least one optical element in the array of optical elements; and
    securing, in response to the difference being less than or equal to the acceptable range of error, the array of optical elements over the array of optoelectronic devices.

16. The method of claim 15, wherein each of the optical elements in the array of optical elements can be independently adjusted.

17. The method of claim 15, further comprising adjusting at least one optical element in the array of optical elements in order to form emission uniformity.

18. The method of claim 15, further comprising adjusting at least one optical element in the array of optical elements in order to form a target emission beam shape.

\* \* \* \* \*